(12) United States Patent
Lee et al.

(10) Patent No.: US 11,898,244 B2
(45) Date of Patent: Feb. 13, 2024

(54) PLASMA-ENHANCED CHEMICAL VAPOR DEPOSITION METHOD OF FORMING LITHIUM-BASED FILM BY USING THE SAME

(71) Applicant: SAMSUNG ELECTRONICS CO., LTD., Suwon-si (KR)

(72) Inventors: Jooho Lee, Hwaseong-si (KR); Yongsung Kim, Suwon-si (KR); Sanghoon Song, Hwaseong-si (KR); Wooyoung Yang, Hwaseong-si (KR); Changseung Lee, Yongin-si (KR); Sungjin Lim, Suwon-si (KR); Junsik Hwang, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 95 days.

(21) Appl. No.: 17/497,523

(22) Filed: Oct. 8, 2021

(65) Prior Publication Data
US 2022/0025515 A1    Jan. 27, 2022

Related U.S. Application Data

(62) Division of application No. 15/368,892, filed on Dec. 5, 2016, now abandoned.

(30) Foreign Application Priority Data

Jul. 11, 2016    (KR) .......................... 10-2016-0087382

(51) Int. Cl.
C23C 16/34        (2006.01)
C23C 16/50        (2006.01)
(Continued)

(52) U.S. Cl.
CPC .............. *C23C 16/34* (2013.01); *C23C 16/00* (2013.01); *C23C 16/06* (2013.01);
(Continued)

(58) Field of Classification Search
CPC ..... C23C 16/34; C23C 16/06; C23C 16/4408; C23C 16/45536
See application file for complete search history.

(56) References Cited

U.S. PATENT DOCUMENTS 6,025,094 A    2/2000  Visco et al.
7,381,644 B1   6/2008  Subramonium et al.
(Continued)

FOREIGN PATENT DOCUMENTS

CN    110527974 A      * 12/2019
JP    2013-105732       * 5/2013  .......... H01M 10/058
(Continued)

OTHER PUBLICATIONS

Kozen, Alexander C., et al., "Atomic Layer Deposition of the Solid Electrolyte LiPON". Chemistry of Materials, 2015, 27, 5324-5331.*
(Continued)

*Primary Examiner* — Bret P Chen
(74) *Attorney, Agent, or Firm* — Sughrue Mion, PLLC

(57) ABSTRACT

A method of forming a lithium (Li)-based film, may include: supplying a Li source material into a reaction chamber in which a substrate is disposed; supplying phosphor (P) and oxygen (O) source materials and a nitrogen (N) source material into the reaction chamber; and generating plasma in the reaction chamber to form a Li-based film on the substrate from the Li, P, O, and N source materials, wherein the supplying of the Li source material into the reaction chamber and the supplying of the P and O source materials and the N source material into the reaction chamber are performed with a time interval, and wherein the Li source
(Continued)

material supplied into the reaction chamber is deposited on the substrate, and the P and O source materials supplied into the reaction chamber are adsorbed on the Li source material.

10 Claims, 17 Drawing Sheets

(51) Int. Cl.

| | |
|---|---|
| C23C 16/06 | (2006.01) |
| C23C 16/44 | (2006.01) |
| H01M 4/04 | (2006.01) |
| H01M 10/052 | (2010.01) |
| H01J 37/32 | (2006.01) |
| H01M 16/00 | (2006.01) |
| C23C 16/00 | (2006.01) |

(52) U.S. Cl.
CPC .......... *C23C 16/4408* (2013.01); *C23C 16/50* (2013.01); *H01J 37/32* (2013.01); *H01J 37/3244* (2013.01); *H01M 4/0428* (2013.01); *H01M 10/052* (2013.01); *H01M 16/00* (2013.01); *H01J 2237/3321* (2013.01); *H01M 2220/30* (2013.01); *H01M 2300/0068* (2013.01)

(56) References Cited

U.S. PATENT DOCUMENTS

| | | | |
|---|---|---|---|
| 8,257,866 B2 | 9/2012 | Loveness et al. | |
| 9,920,426 B2* | 3/2018 | Shindo | C23C 16/45555 |
| 2003/0118897 A1* | 6/2003 | Mino | H01L 23/58 |
| | | | 429/149 |
| 2004/0175905 A1 | 9/2004 | Won et al. | |
| 2005/0008772 A1* | 1/2005 | Zhang | H01M 10/0562 |
| | | | 427/126.1 |
| 2005/0016458 A1 | 1/2005 | Zhang et al. | |
| 2006/0115594 A1 | 6/2006 | Moffat et al. | |
| 2010/0124621 A1 | 5/2010 | Kobayashi et al. | |
| 2012/0276305 A1 | 11/2012 | Hamalainen et al. | |
| 2012/0282527 A1* | 11/2012 | Amine | B82Y 40/00 |
| | | | 977/734 |
| 2013/0260024 A1 | 10/2013 | Jodin et al. | |
| 2013/0309401 A1 | 11/2013 | Miyatake | |
| 2015/0279681 A1 | 10/2015 | Knoops et al. | |
| 2015/0287916 A1 | 10/2015 | Campbell et al. | |
| 2016/0281223 A1 | 9/2016 | Sowa et al. | |
| 2017/0005338 A1* | 1/2017 | Human | H01M 4/82 |
| 2017/0067161 A1 | 3/2017 | Shindo et al. | |
| 2017/0162369 A1 | 6/2017 | Kang et al. | |
| 2020/0028208 A1* | 1/2020 | Dasgupta | H01M 10/0585 |
| 2020/0152976 A1* | 5/2020 | Cui | H01M 4/525 |
| 2021/0376310 A1* | 12/2021 | Dasgupta | H01M 4/0404 |

FOREIGN PATENT DOCUMENTS

| | | |
|---|---|---|
| KR | 10-2013-0079526 A | 7/2013 |
| KR | 10-2014-0035311 A | 3/2014 |
| KR | 10-1598485 B1 | 2/2016 |

OTHER PUBLICATIONS

Lie, Jian, et al., "Elegant design of electrode and electrode/ electrolyte interface in lithium-ion batteries by atomic layer deposition". Nanotechnology 26 (2015) 024001 pp. 1-14.*
Nisula, Mikko, et al., "Atomic Layer Deposition of Lithium Phosphorus Oxynitride". Chemistry of Materials, 2015, 27, 6987-6993.*
Pearse, Alexander J., et al., "Nanoscale Solid State Batteries Enabled By Thermal Atomic Layer Deposition of a Lithium Polyphosphazene Solid State Electrolyte". Chemistry of Materials, 2017, 29, 3740-3753.*
Put, B., et al., "Plasma-assisted ALD of LiPO(N) for Solid State Batteries". 2017 ECS Transactions, 75 (20) 61-69 (2017).*
Nam, Young Jin, et al., "Bendable and Thin Sulfide Solid Electrolyte Film: A New Electrolyte Opportunity for Free-Standing and Stackable High-Energy All-Solid-State Lithium-Ion Batteries". Nano Letters, 2015, 15, 3317-3323.*
Ohta, Hiromichi, et al., "Lithium-ion conducting La2/3-xLi3xTiO3 solid electrolyte thin films with stepped and terraced surfaces". Applied Physics Letters 100, 173107 (2012), 1-4.*
Alexander C. Kozen et al., "Atomic Layer Deposition of the Solid Electrolyte LiPON", Chemistry of Materials, American Chemical Society, 2015, vol. 27, pubs.acs.org/cm, DOI: 10.1021/acs.chemmater.5b01654, pp. 5324-5331, XP055405405.
Communication dated Sep. 18, 2017, from the European Patent Office in counterpart European Application No. 17150850.0.
Pierson, H.O. (1999). Handbook of Chemical Vapor Deposition (CVD)—Principles, Technology and Applications (2nd Edition)—5.1.1 CVD Processes, (pp. 111-115). William Andrew Publishing/Noyes. Retrieved from https://app.knovel.com/hotlink/pdf/id:kt0064HAK2/handbook-chemical-vapor/cvd-processes (Year: 1999).
Communication dated Feb. 28, 2023 from the Korean Intellectual Property Office in Korean Application No. 10-2016-0087382.

* cited by examiner

PLASMA-ENHANCED CHEMICAL VAPOR DEPOSITION METHOD OF FORMING LITHIUM-BASED FILM BY USING THE SAME

CROSS-REFERENCE TO RELATED APPLICATION

This application is a divisional of U.S. application Ser. No. 15/368,892 filed Dec. 5, 2016, now abandoned, claims priority from Korean Patent Application No. 10-2016-0087382, filed on Jul. 11, 2016 in the Korean Intellectual Property Office, the disclosures of which are incorporated herein by reference in their entireties.

BACKGROUND

1. Field

Apparatuses and methods consistent with exemplary embodiments relate to forming a lithium (Li)-based film.

2. Description of the Related Art

Due to the development of technologies in the field of electronics, the market for portable electronic devices (e.g., smartphones, smartpads, e-book readers, tablet computers, etc.) has rapidly grown. As the market grows, the demand for batteries suitable for operating such portable electronic devices has increased as well.

Unlike primary batteries that are not chargeable, secondary batteries refer to batteries that are chargeable and dischargeable. In particular, lithium secondary batteries have an advantage of a high energy density per unit weight. High power secondary batteries using an electrode having a three-dimensional (3D) structure has been developed. In this regard, the technologies to form a Li-based solid electrolyte film on a 3D-structured electrode have been developed.

SUMMARY

One or more exemplary embodiments provide a plasma-enhanced chemical vapor deposition apparatus and a method of forming a lithium (Li)-based film by using the same According to an aspect of an embodiment, there is provided a plasma-enhanced chemical vapor deposition apparatus for depositing a lithium (Li)-based film on a surface of a substrate including: a reaction chamber in which the substrate is disposed; a first source supply configured to supply a Li source material into the reaction chamber; a second source supply configured to supply phosphor (P) and oxygen (O) source materials and a nitrogen (N) source material into the reaction chamber; a power supply configured to supply power into the reaction chamber to generate plasma in the reaction chamber; and a controller configured to control the power supply to turn on or off generation of the plasma.

The second source supply may be further configured to supply the P and O source materials and the N source material into the reaction chamber with a time interval from a time when the Li source material is supplied into the reaction chamber. The Li source material supplied into the reaction chamber by the first source supply may be adsorbed on the surface of the substrate, and the P and O source materials supplied into the reaction chamber by the second source supply is adsorbed on the Li source material.

When the second source supply supplies the P and O source materials and the N source material into the reaction chamber, the controller may controls the power supply to form a bonding between the P source material and the N source material (P—N bonding) using the plasma.

The controller may control an on-off time of the generation of the plasma to adjust an amount of the N source material supplied into the reaction chamber.

The Li source material may include at least one of lithium hexamethyldisilazide (Li-HMDS), Li(CH$_2$SiMe$_3$), LiOtBu, Li(acac), and Li(thd). The P and O source materials may include at least one of trimethyl phosphate (TMPO), triethyl phosphate (TEPO), and diethyl phosphoramidate (DEPA).

The N source material may include at least one of a N$_2$ reactive gas and a NH$_3$ reactive gas that move the P and O source materials into the reaction chamber.

According to an aspect of another exemplary embodiment, there is provided a method of forming a lithium (Li)-based film includes supplying a Li source material into a reaction chamber in which a substrate is disposed, supplying phosphor (P) and oxygen (O) source materials and a nitrogen (N) source material into the reaction chamber, and generating plasma in the reaction chamber to form a Li-based film on the substrate from the Li, P, O, and N source materials.

The supplying of the Li source material into the reaction chamber and the supplying of the P and O source materials and the N source material into the reaction chamber may be performed with a time interval.

The method may further include purging an interior of the reaction chamber between the supplying of the Li source material into the reaction chamber and the supplying of the P and O source materials and the N source material into the reaction chamber.

The Li source material supplied into the reaction chamber may be deposited on the substrate, and the P and O source materials supplied into the reaction chamber may be adsorbed on the Li source material.

A bonding between the P source material and the N source material (P—N bonding) may be formed by generating the plasma in the reaction chamber when the P and O source materials and the N source material are supplied into the reaction chamber.

An amount of the N source material supplied into the reaction chamber may be adjusted by controlling an on-off time of generation of the plasma. The method may further include purging an interior of the reaction chamber after the Li-based film is formed on the substrate. A reaction temperature of the substrate in a process of forming the Li-based film may be about 100° C. to about 450° C.

The substrate may include at least one three-dimensional (3D) structure having an aspect ratio of 1:1 or greater. The 3D structure may include a cathode having a 3D structure, and the Li-based film may include a solid electrolyte film deposited on a surface of the cathode.

The 3D structure may include an anode having a 3D structure, and the Li-based film may include a solid electrolyte film or a protective film deposited on a surface of the anode. The 3D structure may include a conductive carbon electrode having a 3D structure, and the Li-based film may include a solid electrolyte film or a protective film deposited on a surface of the conductive carbon electrode.

According to an aspect of another exemplary embodiment, there is provided a plasma-enhanced chemical vapor deposition apparatus including: a substrate disposed in a reaction chamber; a first source supply configured to supply a Li source material into the reaction chamber at a first time to deposit the Li source material on the substrate; a second source supply configured to supply phosphor (P) and oxygen (O) source materials and a nitrogen (N) source material into the reaction chamber at a second time subsequent to the first time to be absorbed by the Li source material deposited on the substrate; and a power supply configured to supply power into the reaction chamber to generate plasma that causes the P source material to react with the N source material at the second time.

The apparatus may further include a purging gas supply configured to supply a purging gas into the reaction chamber to remove the Li source material remaining in the chamber after the Li source material is deposited on the substrate at time $t_1$ before the P, O, and N source materials are supplied into the reaction chamber at the second time.

The power supply may be further configured to control an on-off time of generation of the plasma at the second time.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
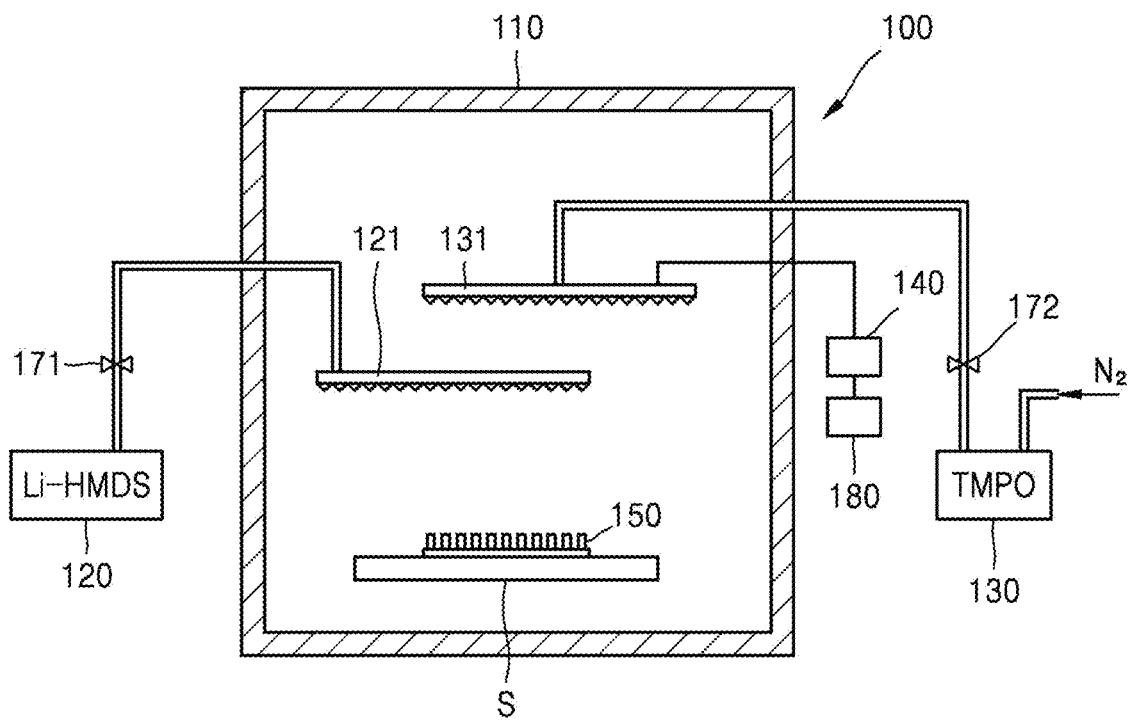
FIG. 1 schematically illustrates a plasma-enhanced chemical vapor deposition apparatus according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

FIG. 1 schematically illustrates a plasma-enhanced chemical vapor deposition (PECVD) apparatus 100 according to an exemplary embodiment.

Referring to FIG. 1, the PECVD apparatus 100 according to the exemplary embodiment includes a lithium (Li)-based film such as a LiPON film or a LiSiPON film that is deposited on a surface of a substrate 150.

The PECVD apparatus 100 may include a reaction chamber 110, first and second source supply units 120 and 130, a power supply unit 140, and a controller 180. A substrate 150 on which a Li-based film is to be deposited is placed in the reaction chamber 110. The substrate 150 may be loaded on a stage S. In a film forming process, a reaction temperature of the substrate 150 may be, for example, about 100° C. to about 450° C. However, the present exemplary embodiment is not limited thereto.

Figure 2:
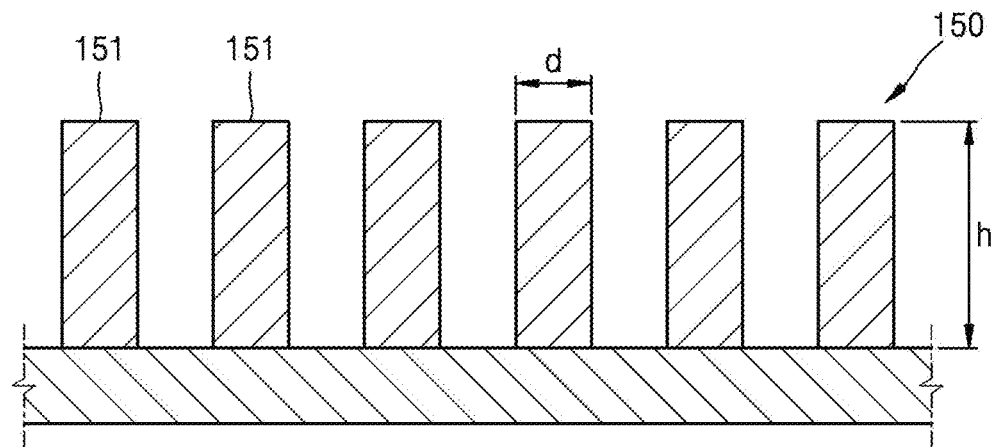
FIG. 2 is an enlarged view of a substrate of FIG. 1.

FIG. 2 illustrates the substrate 150 on which a Li-based film is to be deposited. Referring to FIG. 2, the substrate 150 may include at least one 3D structure 151 having a certain aspect ratio. The aspect ratio denotes a ratio of a height h to a width d of the 3D structure 151 (e.g., the ratio of h to d=h:d=h/d). Each 3D structure 151 may have an aspect ratio of, for example, 1:1 or greater, but the present exemplary embodiment is not limited thereto.

The first source supply unit 120 may be provided outside the reaction chamber 110 to supply a Li source material into the reaction chamber 110. The Li source material may include at least one of, for example, lithium hexamethyldisilazide (Li-HMDS), Li(CH$_2$SiMe$_3$), LiOtBu, Li(acac), and Li(thd). However, the present exemplary embodiment is not limited thereto.

A first source distribution unit 121 may be provided in the reaction chamber 110 and connected to the first source supply unit 120. The first source distribution unit 121 may uniformly distribute in the reaction chamber 110 the Li source material supplied by the first source supply unit 120. A first valve 171 may be disposed at a conduit that connects the first source supply unit 120 to the first source distribution unit 121 to control the passage of the Li source material through the conduit. The first valve 71 may be provided between the first source supply unit 120 and the first source distribution unit 121 to regulate the flow of the Li source material that moves into the reaction chamber 110. When the first source supply unit 120 uses a material including, for example, Li and Si, as a source material, a Si source material may be further supplied into the reaction chamber 110 in addition to the Li source material.

In a state in which plasma is not yet generated in the reaction chamber 110, when Li source material is supplied into the reaction chamber 110 from the first source supply unit 120 via the first source distribution unit 121, the Li source material may be adsorbed on a surface of the substrate 150.

The second source supply unit 130 may be provided outside the reaction chamber 110 and supply phosphor (P) and oxygen (O) source materials and a nitrogen (N) source material into the reaction chamber 110. The P and O source materials may include at least one of trimethyl phosphate (TMPO), triethyl phosphate (TEPO), and diethyl phosphoramidate (DEPA). However, the present exemplary embodiment is not limited thereto and the N source material may include at least one of a N$_2$ reactive gas and NH$_3$ reactive gas. The N source material may be used as a reactive gas and may also move the P and O source materials into the reaction chamber 110. In FIG. 1, for example, a $N_2$ reactive gas is used as the N source material.

A second source distribution unit 131 may be provided in the reaction chamber 110 and connected to the second source supply unit 130. The second source distribution unit 131 may uniformly distribute in the reaction chamber 110 the P and O source materials and the N source material supplied by the second source supply unit 130. A second valve 172 may be disposed at a conduit that connects the second source supply unit 130 to the second source distribution unit 131 to control the passage of the P and O source materials and the N source material through the conduit. The second valve 172 may be provided between the second source supply unit 130 and the second source distribution unit 131 to regulate the flow of the P and O source materials and the N source material into the reaction chamber 110.

The second source supply unit 130 may supply the source materials into the reaction chamber 110 with a time gap from a supply time of the first source supply unit 120. In detail, the first source supply unit 120 first supplies the Li source material into the reaction chamber 110 The Li source material is adsorbed on the surface of the substrate 150. Next, impurities including the Li source material remaining in the reaction chamber 110 are removed by purging. Then, the second source supply unit 130 supplies the P and O source materials and the N source material into the reaction chamber 110.

In a state in which plasma is not yet generated in the reaction chamber 110, when the P and O source materials and the N source material are supplied into the reaction chamber 110 from the second source supply unit 130 via the second source distribution unit 131, the P and O source materials may be adsorbed on Li source material on the surface of the substrate 150.

The power supply unit 140 may supply power to generate plasma in the reaction chamber 110. Although the power supply unit 140 may include, for example, radio frequency (RF) power, the present exemplary embodiment is not limited thereto. Although the power supply unit 140 may be connected to the second source distribution unit 131, the present exemplary embodiment is not limited thereto. The controller 180 may turn on or off the plasma generated in the reaction chamber 110 by controlling the power supply unit 140. The controller 180 may be implemented by a processor and integrated into the power supply unit 140.

The controller 180 may generate plasma in the reaction chamber 110 by driving the power supply unit 140 in the process in which the second source supply unit 130 supplies the P and O source materials and the N source material into the reaction chamber 110. In detail, the controller 180 may generate plasma in the reaction chamber 110 in the second period of the process in which the second source supply unit 130 supplies the P and O source materials and the N source material into the reaction chamber 110.

In detail, no plasma is generated in the reaction chamber 110 in the first period of the process in which the second source supply unit 130 supplies the P and O source materials and the N source material into the reaction chamber 110. In this case, as described above, the P and O source materials may be adsorbed on the Li source material on the surface of the substrate 150.

In the second period of the process in which the second source supply unit 130 supplies the P and O source materials and the N source material into the reaction chamber 110, as the controller 180 drives the power supply unit 140, plasma is generated in the reaction chamber 110. In this case, as plasma is generated in the reaction chamber 110 in a nitrogen atmosphere, P—N bonding is formed and, the source materials adsorbed on the surface of the substrate 150 react to each other, and thus a Li-based film may be deposited on the surface of the substrate 150.

As such, the controller 180 may generate plasma in the reaction chamber 110 by driving the power supply unit 140 in the process in which the second source supply unit 130 supplies the P and O source materials and the N source material into the reaction chamber 110. In this case, when the controller 180 controls an on-off time of plasma, an amount of the N source material such as a $N_2$ gas supplied into the reaction chamber 110 may be regulated.

The Li-based film may be deposited at a relatively fast speed and uniformly on a surface of the 3D structure having a high aspect ratio, as described below, by using the PECVD apparatus 100 according to the embodiment.

A method of forming a Li-based film on a surface of a substrate according to an exemplary embodiment is described hereinafter. In general, the same process is repeated a plurality of times in a process of forming a Li-based film. In the following description, one cycle of the process is described for convenience of explanation.

Figure 3:
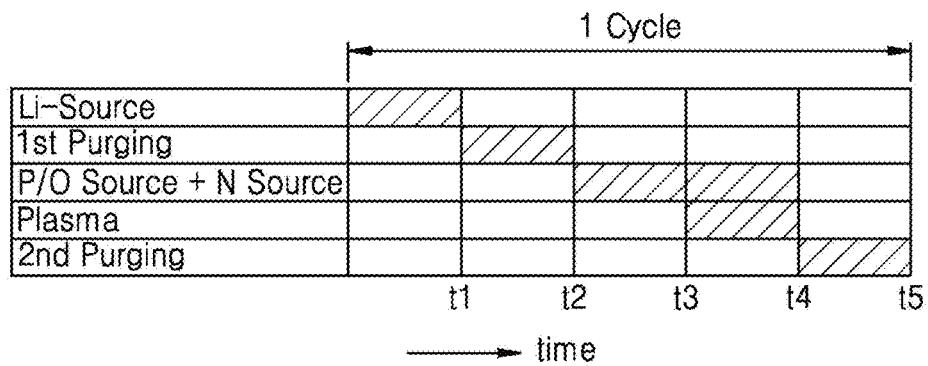
FIG. 3 is a process diagram schematically illustrating a method of forming a lithium (Li)-based film, according to an exemplary embodiment.
Figure 4:
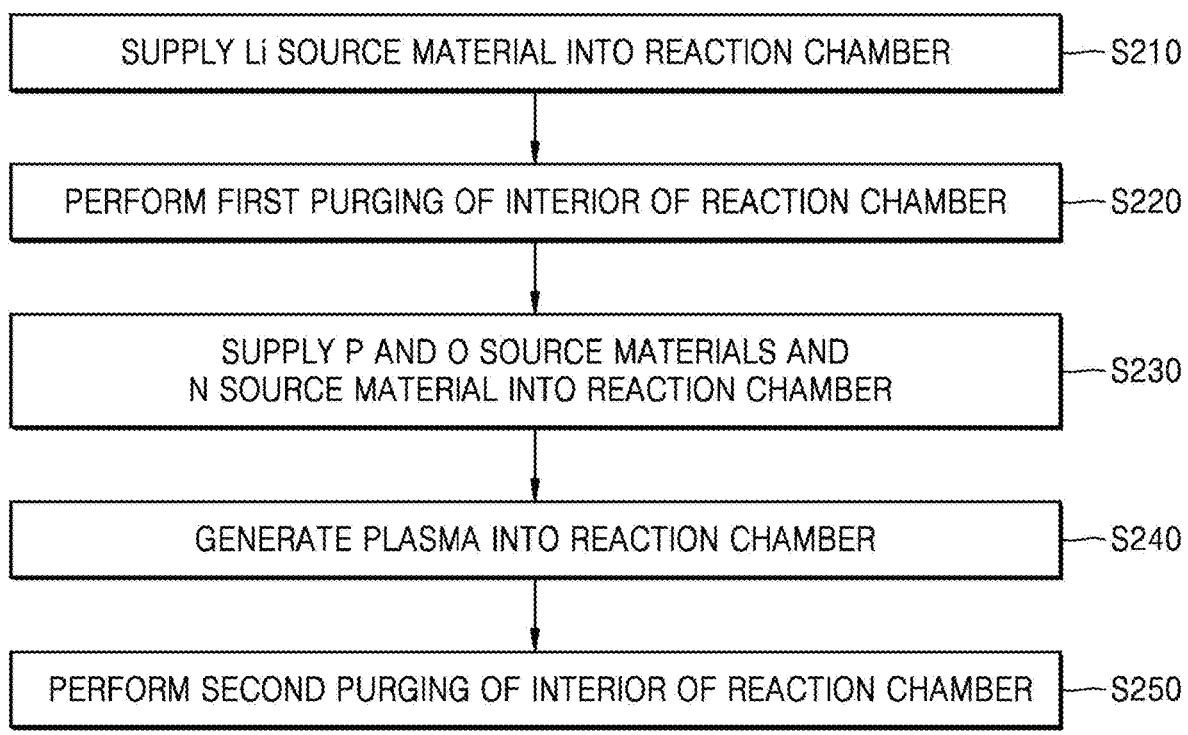
FIG. 4 is a flowchart of the method of FIG. 3.

FIG. 3 is a process diagram schematically illustrating a method of forming a Li-based film according to an embodiment. FIG. 4 is a flowchart of the method of FIG. 3.

Referring to FIGS. 3 and 4, a Li source material is supplied into the reaction chamber 110 of FIG. 1 in which the substrate 150 of FIG. 1 is placed (operation S210). In this state, although a reaction temperature of the substrate 150 may be, for example, about 100° C. to about 450° C., the present exemplary embodiment is not limited thereto. The process of supplying the Li source material may be performed from a start point to a point t1 in the process diagram of FIG. 3. As such, when the Li source material is supplied into the reaction chamber 110, the Li source material may be adsorbed on the surface of the substrate 150.

Next, the interior of the reaction chamber 110 is first purged (operation S220). The first purging may be performed from the point t1 to a point t2 in the process diagram of FIG. 3. Accordingly, impurities including the Li source material remaining in the reaction chamber 110 may be removed by the first purging.

Next, the P and O source materials and the N source material are supplied into the reaction chamber 110 (operation S230). The process of supplying the P and O source materials and the N source material may be performed from the point t2 to a point t4 in the process diagram of FIG. 3. Plasma is generated in the reaction chamber 110 in the process of supplying the P and O source materials and the N source material into the reaction chamber 110 the reaction chamber 110 (operation S240). In detail, plasma is generated in the reaction chamber 110 in the second period of the process of supplying the P and O source materials and the N source material into the reaction chamber 110. The process of generating plasma in the reaction chamber 110 may be performed from a point t3 to the point t4 in the process diagram of FIG. 3.

In the first period of the process of supplying the P and O source materials and the N source material into the reaction chamber 110, that is, in the state in which no plasma is generated in a period from the point t2 to the point t3 in the process diagram of FIG. 3, the reaction chamber 110, the P and O source materials and the N source material are supplied into the reaction chamber 110. Accordingly, the interior of the reaction chamber 110 is in an atmosphere of the N source material, and the P and O source materials may be adsorbed on the Li source material on the surface of the substrate 150.

In the second period of the process of supplying the P and O source materials and the N source material into the reaction chamber 110, that is, in a period from the point t3 to the point t4 in the process diagram of FIG. 3, plasma is generated as the P and O source materials and the N source material are supplied into the reaction chamber 110. As such, when plasma is generated in the reaction chamber 110, the P—N bonding is formed and the source materials on the surface of the substrate 150 react to each other and thus a Li-based film may be deposited. In this state, an amount of the N source material supplied into the reaction chamber 110 may be regulated by controlling the on-off time of plasma.

Finally, the interior of the reaction chamber 110 is second purged (operation S250). The second purging may be performed from the point t4 to a point t5 in the process diagram of FIG. 3. Impurities including the P and O source materials remaining in the reaction chamber 110 may be removed by the second purging.

FIGS. 5A, 5B, 6, 7A, 7B, 8A, 8B, and 9 illustrate in detail a process of forming a Li-based film on a surface of the substrate 150 by using the PECVD apparatus 100 of FIG. 1.

Figure 5A:
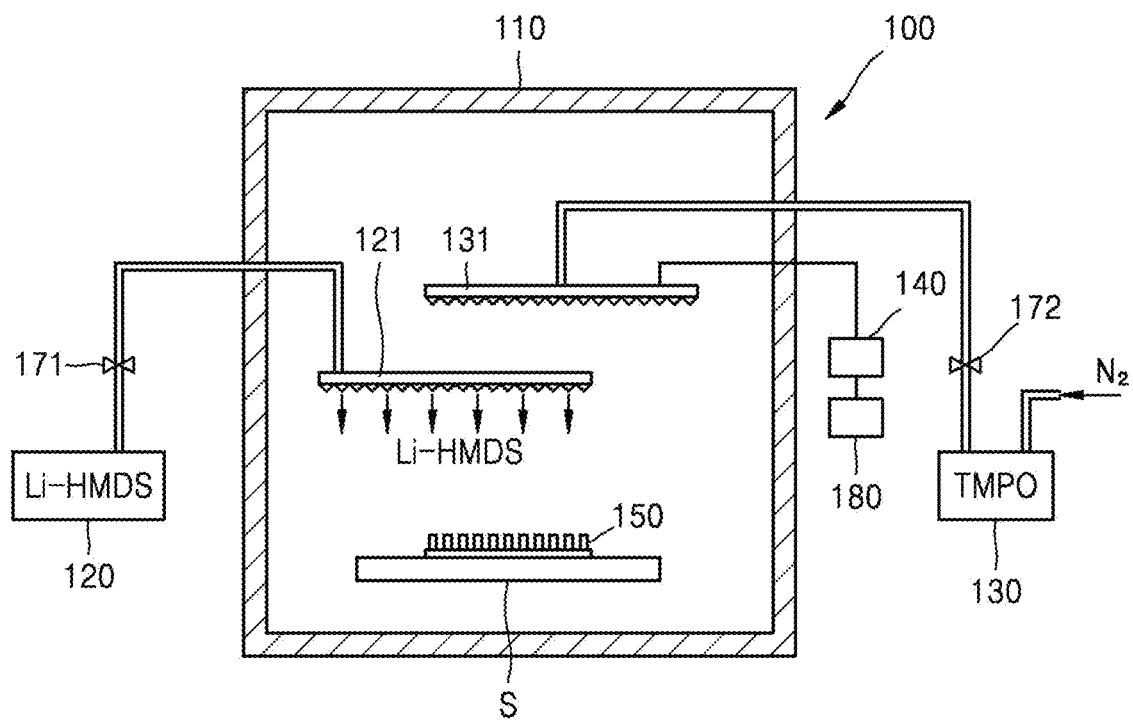
FIGS. 5A, 5B, 6, 7A, 7B, 8A, 8B, and 9 illustrate a process of forming a Li-based film on a surface of the substrate by using the plasma-enhanced chemical vapor deposition apparatus of FIG. 1.
Figure 5B:
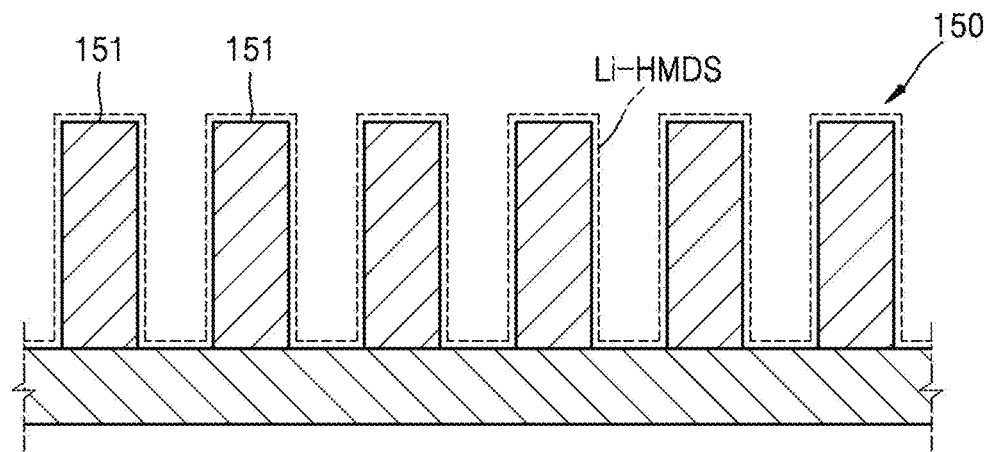

FIG. 5A illustrates that the Li source material is supplied into the reaction chamber 110. FIG. 5B illustrates that the Li source material is adsorbed on the surface of the substrate 150.

Referring to FIG. 5A, the substrate 150 on which a Li-based film is to be deposited is prepared in the reaction chamber 110. The substrate 150 may include at least one 3D structure 151 having an aspect ratio of, for example, 1:1 or greater, but the present exemplary embodiment is not limited thereto. In the process of forming a Li-based film, a reaction temperature of the substrate 150 may be, for example, about 100° C. to about 450° C., but the present exemplary embodiment is not limited thereto.

Next, the first source supply unit 120 supplies the Li source material into the reaction chamber 110. In the process, no plasma is generated in the reaction chamber 110. The processing supplying the Li source material may be performed from the start point to the point t1 in the process diagram of FIG. 3.

The Li source material supplied into the reaction chamber 110 may include at least one of, for example, Li-HMDS, Li(CH$_2$SiMe$_3$), LiOtBu, Li(acac), and Li(thd), but the present exemplary embodiment is not limited thereto. FIG. 5A illustrates an example of using Li-HMDS as the Li source material.

The first source supply unit 120 may uniformly supply the Li source material, for example, Li-HMDS, into the reaction chamber 110 through the first source distribution unit 121. As such, when the Li source material is supplied in a state in which no plasma is generated in the reaction chamber 110, the Li source material, for example, Li-HMDS, may be adsorbed on the surface of the substrate 150 including the 3D structure 151, as illustrated in FIG. 5B.

Figure 6:
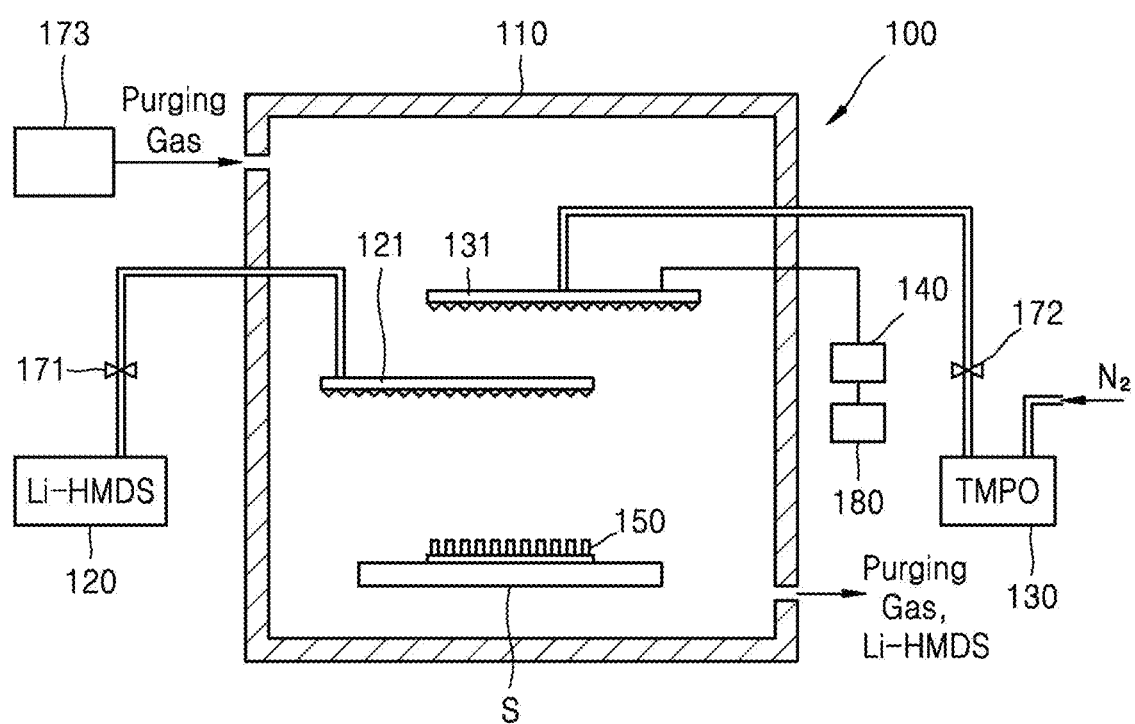

FIG. 6 illustrates that the interior of the reaction chamber 110 is first purged. The PECVD apparatus 100 may further include a purging gas supply unit 173.

Referring to FIG. 6, as described above, after the Li source material is adsorbed on the surface of the substrate 150, impurities including the Li source material remaining in the reaction chamber 110 are removed by using a purging gas supplied from the purging gas supply unit 173. The purging gas may be, for example, an inert gas such as a N$_2$ gas. In detail, when the purging gas such as a N$_2$ gas is supplied into the reaction chamber 110, the impurities including the Li source material remaining in the reaction chamber 110 are discharged to the outside of the reaction chamber 110 with the N$_2$ gas by the purging. Accordingly, the impurities remaining in the reaction chamber 110 may be removed. The first purging may be performing from the point t1 to the point t2 in the process diagram of FIG. 3.

Figure 7A:
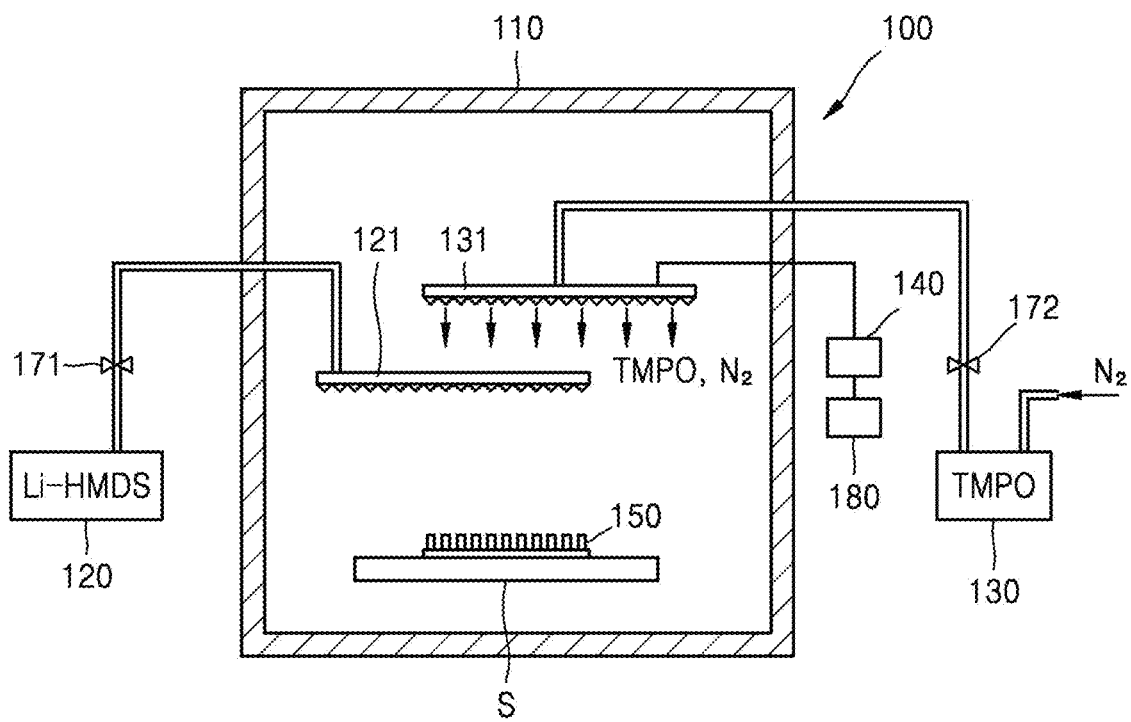
Figure 7B:
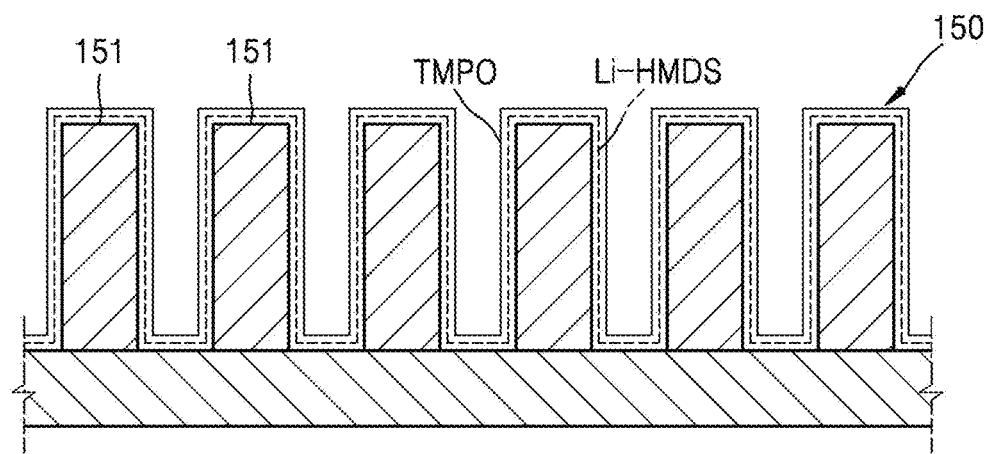

FIG. 7A illustrates that the P and O source materials and the N source material are supplied into the reaction chamber 110. FIG. 7B illustrates that the P and O source materials are adsorbed on the surface of the substrate 150.

Referring to FIG. 7A, the second source supply unit 130 supplies the P and O source materials and the N source material into the reaction chamber 110. In this process, no plasma is generated in the reaction chamber 110. As such, the process of supplying the P and O source materials and the N source material into the reaction chamber 110 in a state in which no plasma is generated in the reaction chamber 110 may be performed from the point t2 to the point t3 in the process diagram of FIG. 3.

Although the P and O source materials supplied into the reaction chamber 110 may include at least one of TMPO, TEPO, and DEPA, the present exemplary embodiment is not limited thereto. FIG. 7A illustrates an example of using TMPO as the P and O source materials. The N source material may include at least one of a N$_2$ reactive gas and a NH$_3$ reactive gas. The N source material may be used as the reactive gas and also move the P and O source materials to the reaction chamber 110. FIG. 7A illustrates an example of using a N$_2$ reactive gas as the N source material.

The second source supply unit 130 may uniformly supply the P and O source materials, for example, TMPO, and the N source material, for example, the N$_2$ reactive gas, into the reaction chamber 110 through the second source distribution unit 131. As such, when the P and O source materials, for example, TMPO, and the N source material, for example, the N$_2$ reactive gas, are supplied into the reaction chamber 110 in a state in which no plasma is generated in the reaction chamber 110, a nitrogen atmosphere is formed in the reaction chamber 110 and, as illustrated in FIG. 7B, the P and O source materials, for example, TMPO, may be adsorbed on the Li source material, for example, Li-HMDS, of the substrate 150.

Figure 8A:
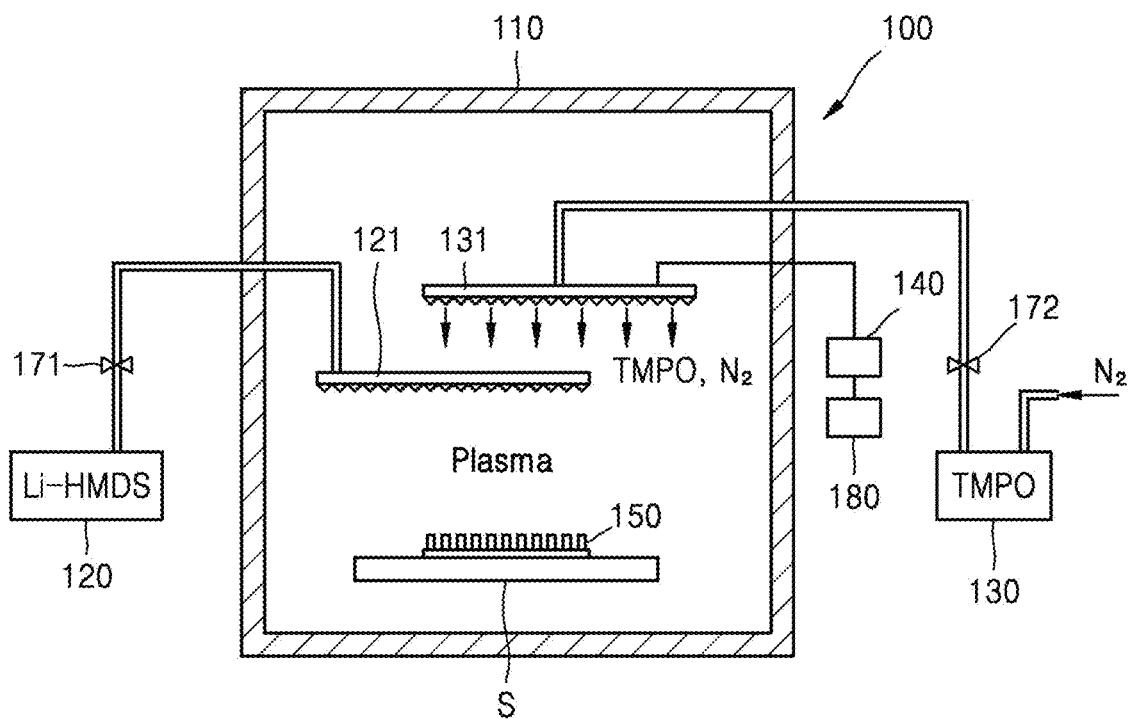
Figure 8B:
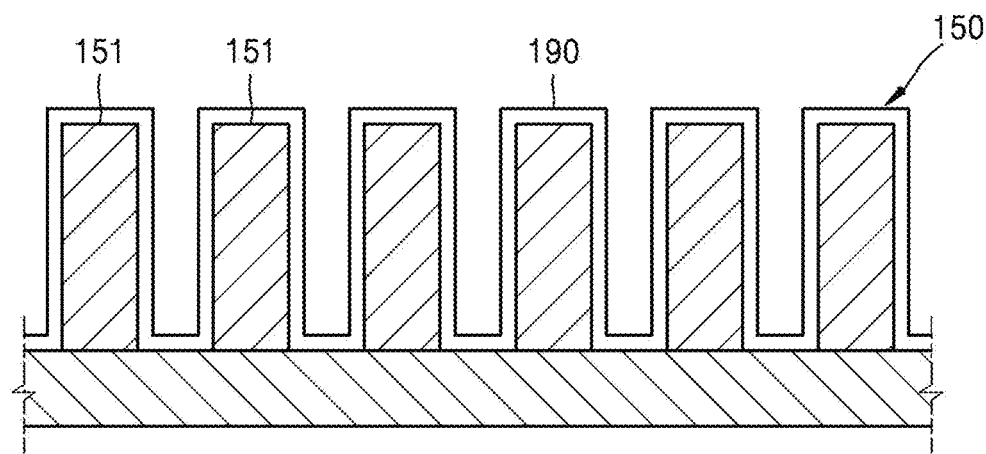

FIG. 8A illustrates that plasma is generated in the reaction chamber 110 during a process of supplying the P and O source materials and the N source material into the reaction chamber 110. FIG. 8B illustrates that a Li-based film 190 is deposited on the surface of the substrate 150.

Referring to FIG. 8A, in the process of supplying the P and O source materials and the N source material into the reaction chamber 110, plasma is generated in the reaction chamber 110. The plasma is generated by driving of the power supply unit 140. As the controller 180 controls the driving of the power supply unit 140, a plasma generation time may be adjusted. As such, the process of generating plasma in the reaction chamber 110 during the process of supplying the P and O source materials and the N source material into the reaction chamber 110 may be performed from the point t3 to the point t4 in the process diagram of FIG. 3.

The process of supplying the P and O source materials and the N source material into the reaction chamber 110 may be performed from the point t2 to the point t4 in the process diagram of FIG. 3. In this regard, in the first period of the process of supplying the P and O source materials and the N source material, that is, in a period from the point t2 to the point t3 in the process diagram of FIG. 3, the P and O source materials and the N source material may be supplied into the reaction chamber 110 in a state in which no plasma is generated in the reaction chamber 110. In the second period of the process of supplying the P and O source materials and the N source material, that is, in a period from the point t3 to the point t4 in the process diagram of FIG. 3, the P and O source materials and the N source material may be supplied into the reaction chamber 110 in a state in which plasma is generated in the reaction chamber 110. The amount of the N source material supplied into the reaction chamber 110 may be adjusted by controlling the on-off time of plasma generated in the reaction chamber 110 by using the controller 180.

As illustrated in FIG. 8A, when plasma is generated in the reaction chamber 110 during the process of supplying the P and O source materials and the N source material into the reaction chamber 110, the P—N bonding is formed in a nitrogen atmosphere and the source materials adsorbed on the surface of the substrate 150 react to each other. Accordingly, as illustrated in FIG. 8B, the Li-based film 190 may be formed on the surface of the substrate 150. In this state, the Li-based film 190 may include, for example, a LiPON film or a LiSiPON film, but the present exemplary embodiment is not limited thereto.

Figure 9:
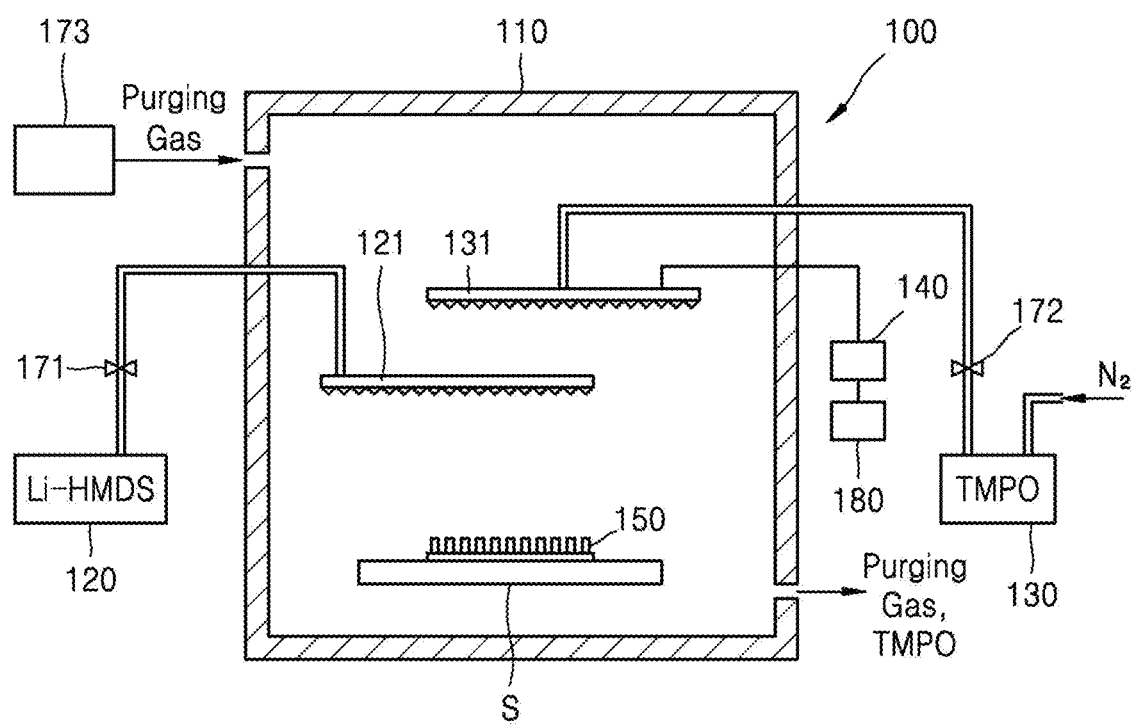

FIG. 9 illustrates that the interior of the reaction chamber 110 is second purged.

Referring to FIG. 9, as described above, after the Li-based film 190 is formed on the surface of the substrate 150, the Impurities including the P and O source materials and so forth remaining in the reaction chamber 110 are removed by using the purging gas supplied from the purging gas supply unit 173. The purging gas may be, for example, an inert gas such as a $N_2$ gas. In detail, when the purging gas such as a $N_2$ gas is supplied into the reaction chamber 110, the impurities including the P and O source materials and so forth remaining in the reaction chamber 110 are discharged to the outside of the reaction chamber 110 with the $N_2$ gas by the purging. Accordingly, the impurities including the P and O source materials and so forth remaining in the reaction chamber 110 may be removed. The second purging may be performing from the point t4 to the point t5 in the process diagram of FIG. 3.

Although only one cycle process for forming the Li-based film 190 on the surface of the substrate 150 is described in the above description, the Li-based film 190 having a desired thickness may be formed by repeating the one cycle process.

As described above, in the method of forming a Li-based film according to the exemplary embodiment, the process of supplying the Li source material into the reaction chamber 110 and the process of supplying the P and O source materials and the N source material into the reaction chamber 110 are performed with a time interval. Accordingly, when plasma is generated in the reaction chamber 110 in the process of supplying the P and O source materials and the N source material into the reaction chamber 110, the impurities including the Li source material are prevented from intruding into the reaction chamber 110. Also, as the controller 180 controls the on-off time of plasma, the supply of the N source material into the reaction chamber 110 may be easily controlled.

Since the source materials are adsorbed on the surface of the substrate 150 in a state in which plasma is not generated, a step coverage problem may be solved. Also, since the Li-based film 190 is deposited in a state in which plasma is generated, the Li-based film 190 may be formed at a relatively fast speed. Accordingly, the Li-based film 190 may be uniformly and at a relatively fast speed deposited on a 3D structure having a high aspect ratio.

A technology of depositing inorganic-based solid electrolyte film such as LiPON on cathodes using a chemical vapor deposition (CVD) method to implement a high output micro battery cell has been reported. In the method, however, when a LiPON solid electrolyte film is deposited on cathodes using a $NH_3$ gas as a source gas at a high temperature, the cathodes may be damaged. Also, a technology of depositing a solid electrolyte film on an electrode having a 3D structure by the PECVD using nitrogen plasma has been reported. In the method, however, a step coverage is generated when an electrode has a 3D structure having a high aspect ratio. When a Li-based solid electrolyte film is deposited by an atomic layer deposition (ALD) method, although the step coverage problem may be solved, a film forming speed decreases.

In the present exemplary embodiment, the process of supplying the Li source material and the process of supplying the P and O source materials and the N source material are separated in terms of time, and the source materials are adsorbed on the surface of the substrate 150 in a state in which no plasma is generated, thereby solving the step coverage problem. Also, since the Li-based film 190 is deposited in a state in which plasma is generated in the process of supplying the P and O source materials and the N source material, the Li-based film 190 may be formed at a relatively fast speed.

Figure 10:
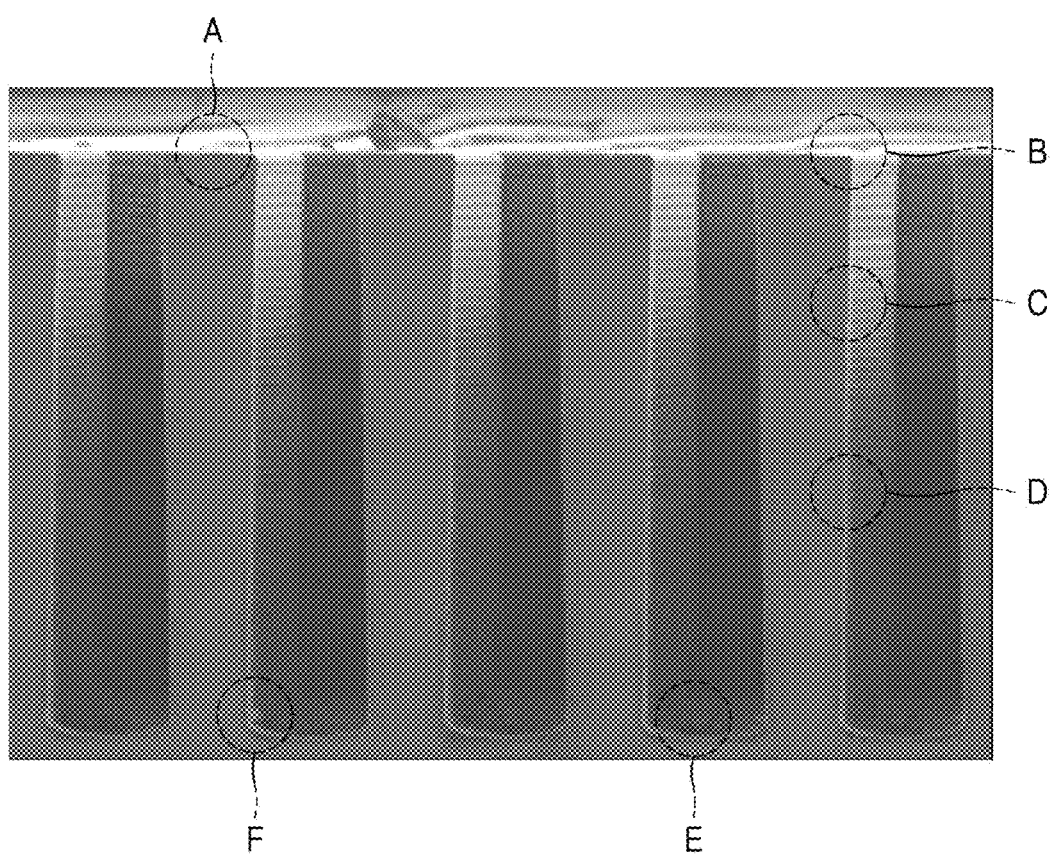
FIG. 10 is an image of the Li-based film formed on three-dimensional (3D) structures by sputtering.
Figure 11A:
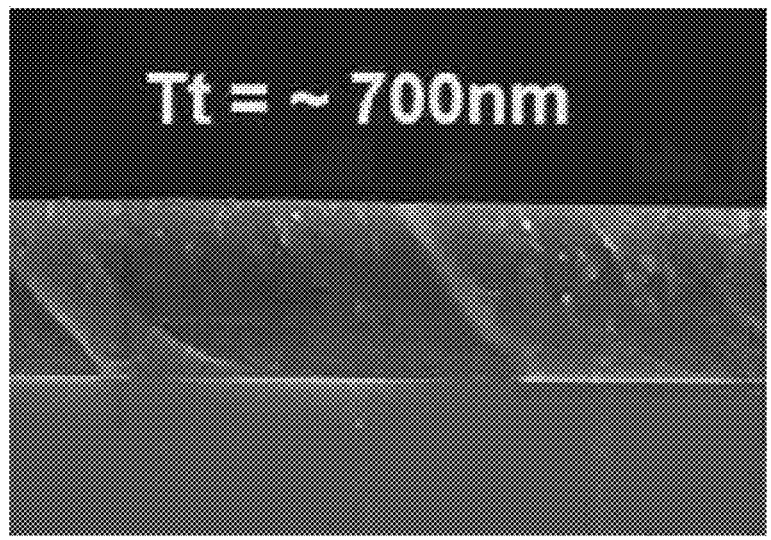
FIGS. 11A, 11B, 11C, 11D, 11E, and 11F are respective images of portions A, B, C, D, E, and F of FIG. 10.
Figure 11B:
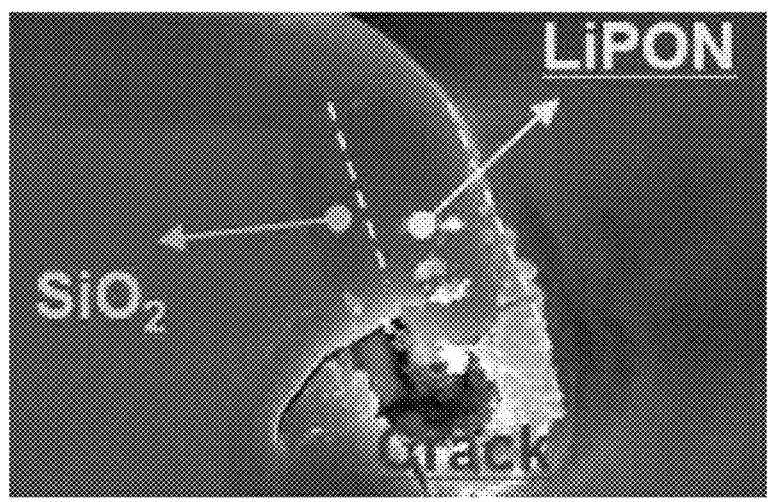
Figure 11C:
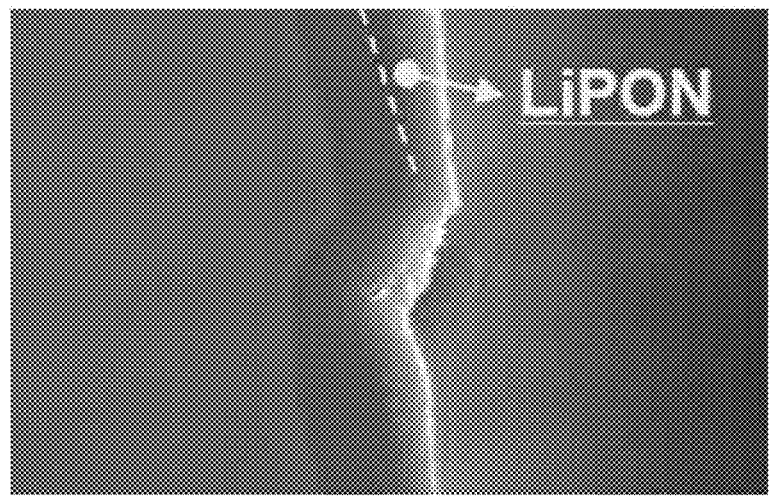
Figure 11D:
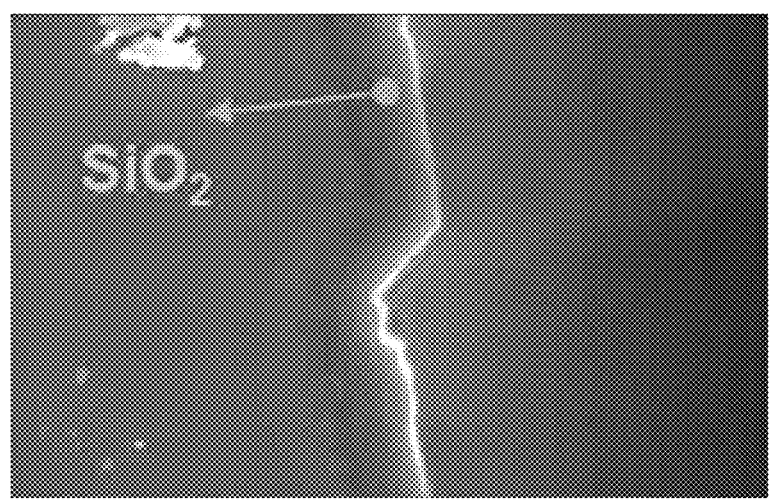
Figure 11E:
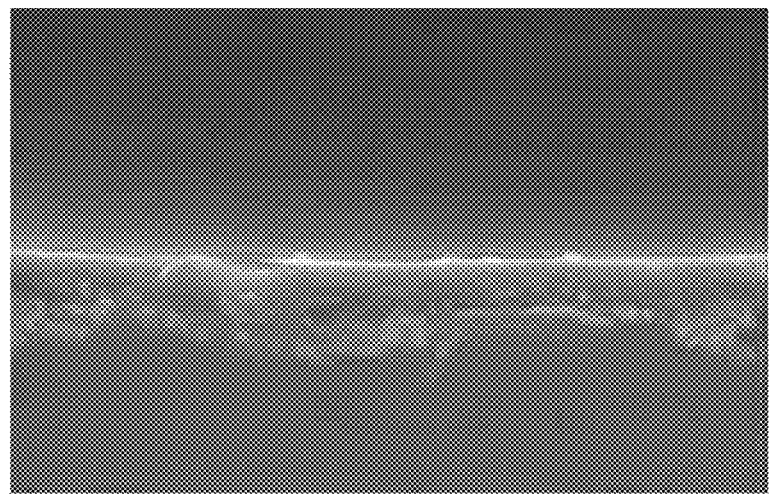
Figure 11F:
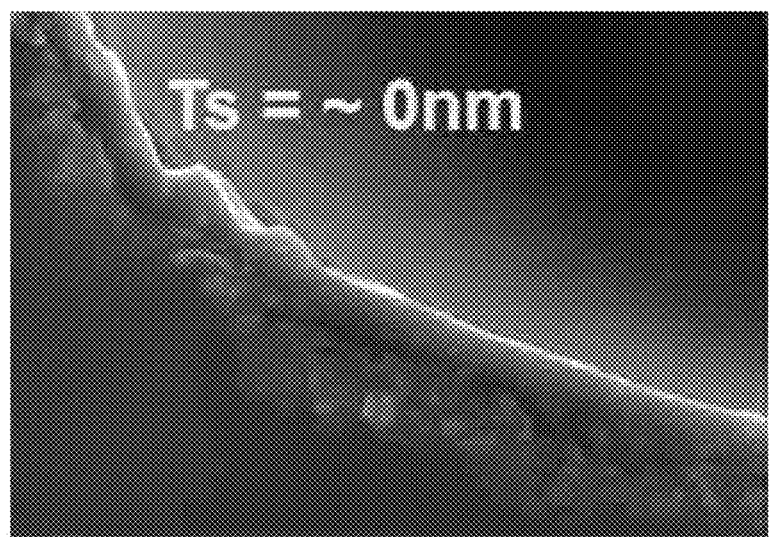

FIG. 10 is an image of the Li-based film formed on 3D structures by sputtering. FIGS. 11A, 11B, 11C, 11D, 11E, and 11F are magnified images of respective portions A, B, C, D, E, and F of FIG. 10 In the drawings, silicon having a surface on which a silicon oxide film is formed is used as the 3D structures, and a LiPON film is used as the Li-based electrolyte film. The width and height of each of the 3D structures are about 10 μm and about 100 μm, respectively, and an interval between the 3D structures is about 10 μm.

Referring to FIGS. 10 and FIGS. 11A to 11F, it may be seen that a Li-based electrolyte film is irregularly formed on surfaces of the 3D structures. In detail, referring to FIG. 11A, a thickness Tt of the Li-based electrolyte film (LiPON film) formed on top of the 3D structure is about 700 nm, and referring to FIG. 11F, a thickness Ts of the Li-based electrolyte film (LiPON film) formed on a bottom of the 3D structure may be about 0 nm. Accordingly, when the Li-based electrolyte film is deposited on the 3D structure having a high aspect ratio by sputtering, a step coverage problem may be generated.

Figure 12:
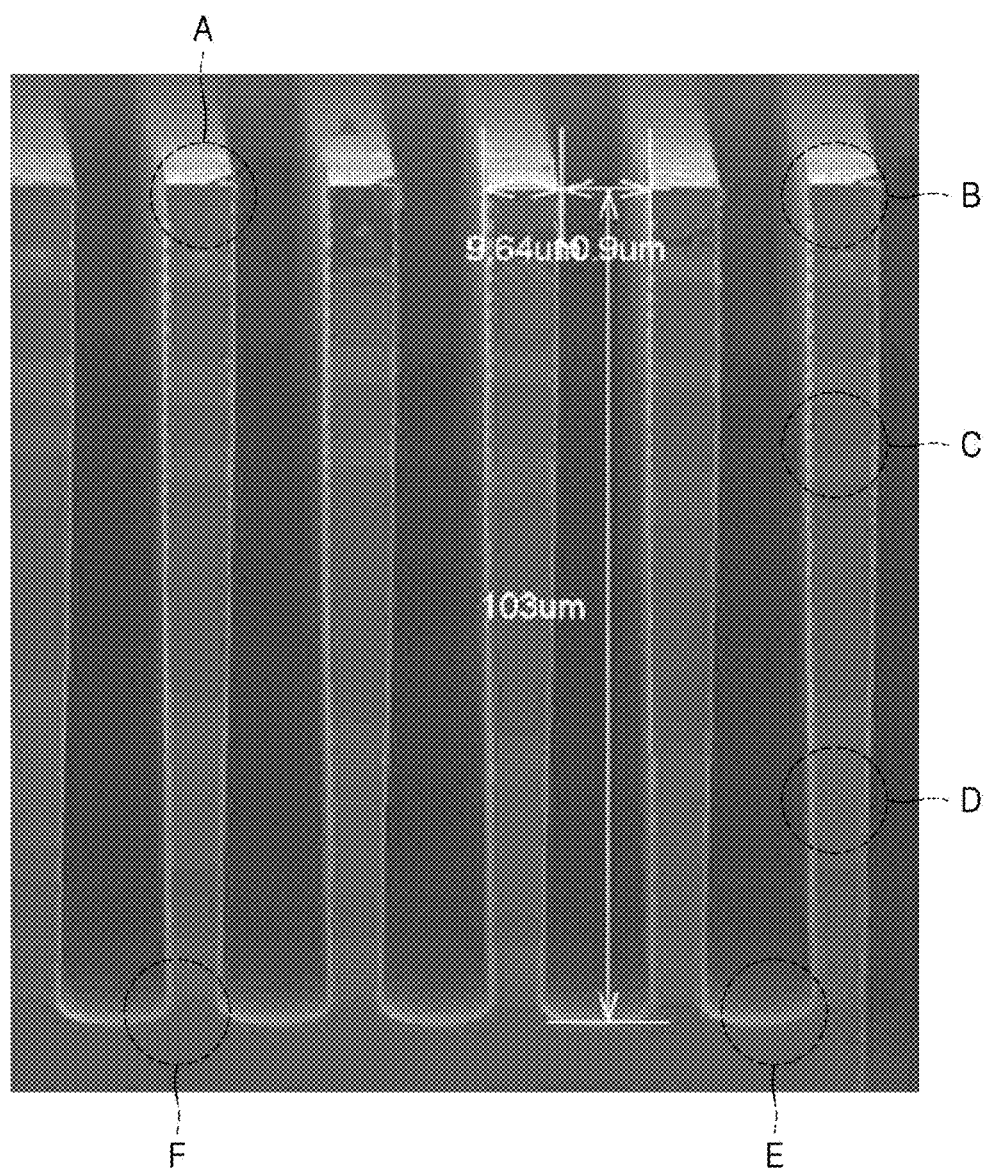
FIG. 12 is an image of a Li-based film formed on 3D structures by a plasma-enhanced chemical vapor deposition method, according to an exemplary embodiment.
Figure 13A:
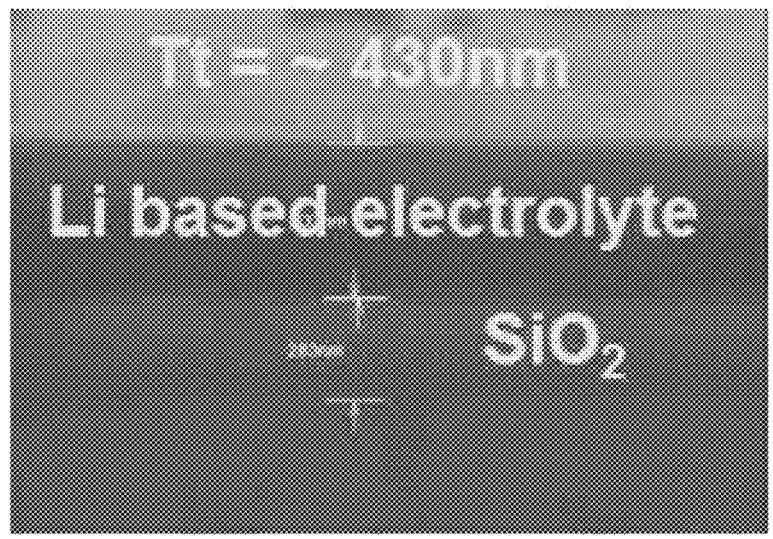
FIGS. 13A, 13B, 13C, 13D, 13E, and 13F are respective images of portions A, B, C, D, E, and F of FIG. 12.
Figure 13B:
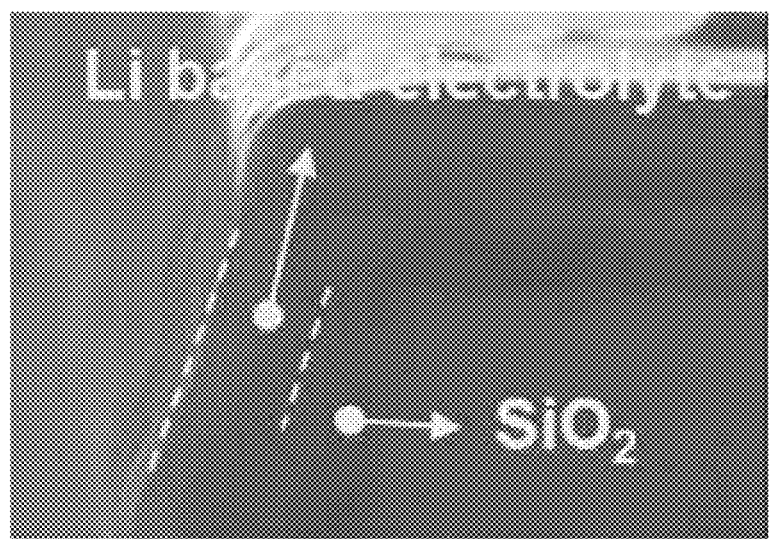
Figure 13C:
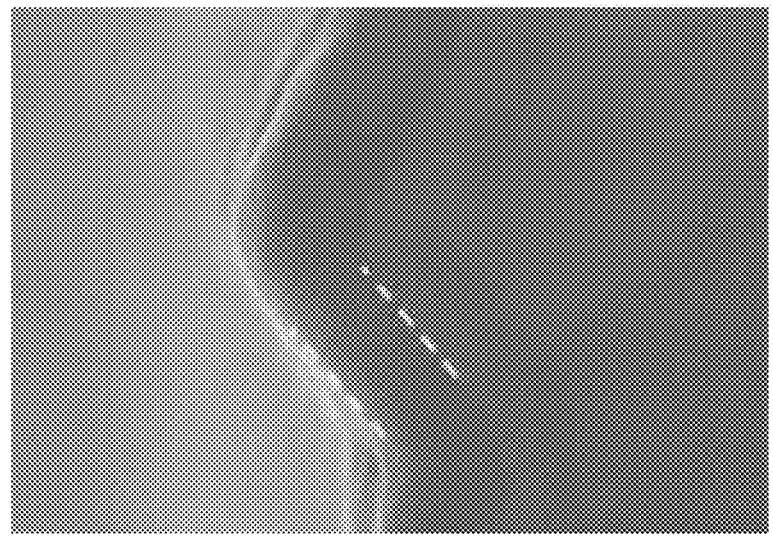
Figure 13D:
Figure 13E:
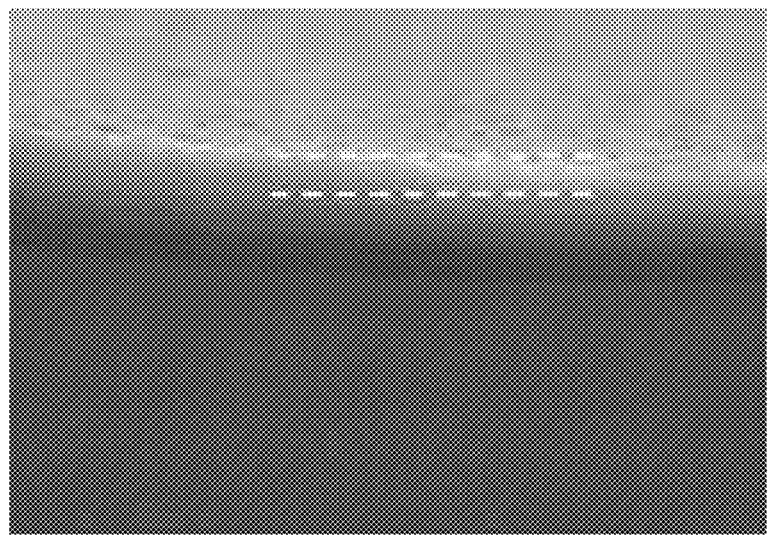
Figure 13F:
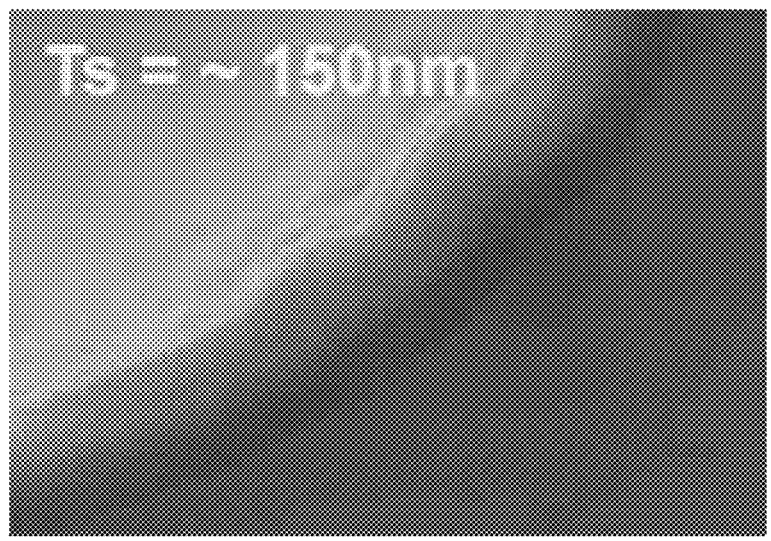

FIG. 12 is an image of a Li-based electrolyte film formed on 3D structures by a PECVD method, according to an exemplary embodiment. FIGS. 13A, 13B, 13C, 13D, 13E, and 13F are magnified images of respective portions A, B, C, D, E, and F of FIG. 12. In the drawings, silicon having a surface on which a silicon oxide film is formed is used as the 3D structures, and a LiPON film is used as the Li-based electrolyte film. The width and height of each of the 3D structures are about 10 μm and about 100 μm, respectively, and an interval between the 3D structures is about 10 μm.

Referring to FIG. 12 and FIG. 13A to FIG. 13F, it may be seen that a Li-based electrolyte film is relatively uniformly formed on surfaces of the 3D structures. In detail, referring to FIG. 13A, a thickness Tt of the Li-based electrolyte film formed on top of the 3D structure is about 430 nm, and referring to FIG. 13F, a thickness Ts of the Li-based electrolyte film formed on a bottom of the 3D structure may be about 150 nm. Accordingly, when the Li-based film is deposited on the 3D structure having a high aspect ratio by the PECVD method according to the present embodiment, the step coverage problem may be solved.

Figure 14:
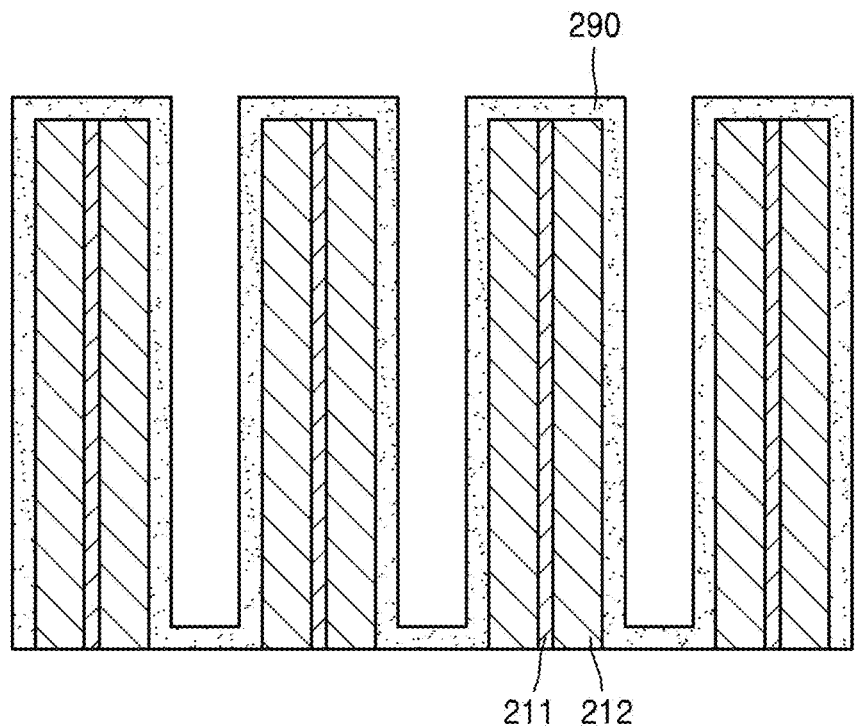
FIG. 14 illustrates a Li-based film formed on cathodes having a 3D structure, according to another exemplary embodiment.

The above-described Li-based film may be applied to various 3D shaped structures. FIG. 14 illustrates a Li-based film 290 formed on cathodes 212 having a 3D structure, according to another embodiment.

Referring to FIG. 14, the Li-based film 290 is deposited on a plurality of 3D structures arranged parallel to each other. Each of the 3D structures may include a collector 211 and a cathode 212 provided on both sides of the collector 211. Each of the 3D structures may have a high aspect ratio of, for example, 1:1 or greater. The Li-based film 290 deposited on the 3D structures may be a solid electrolyte film. The Li-based film 290 may be formed by the PECVD method according to the above-described embodiment.

Figure 15:
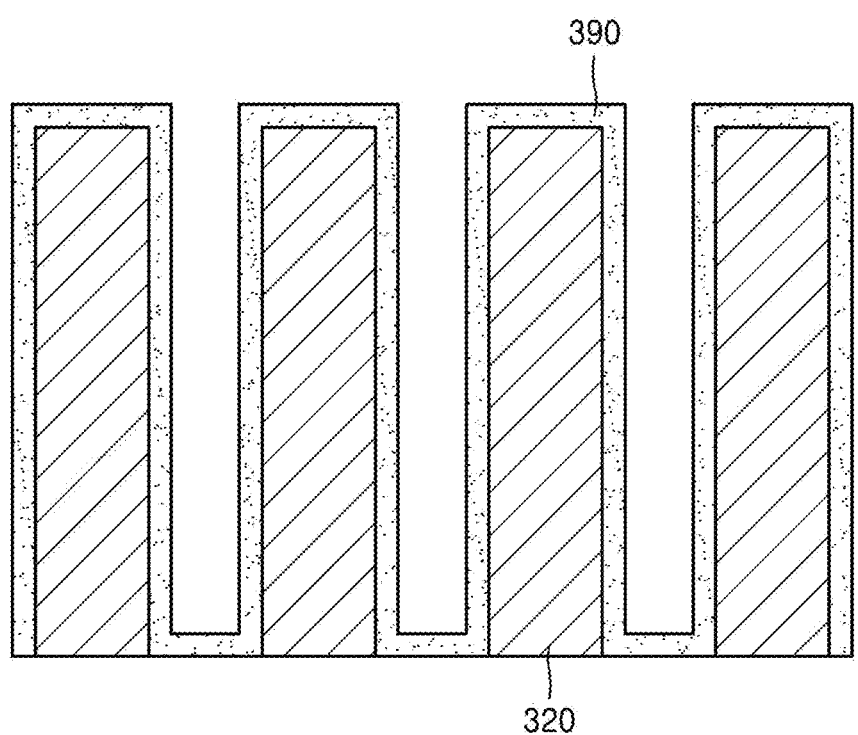
FIG. 15 illustrates a Li-based film formed on anodes having a 3D structure, according to another exemplary embodiment.

FIG. 15 illustrates a Li-based film 390 formed on anodes 320 having a 3D structure, according to another exemplary embodiment.

Referring to FIG. 15, the Li-based film 390 is deposited on the anodes 320 having a 3D structure arranged parallel to each other. Each of the anodes 320 may have a high aspect ratio of, for example 1:1 or greater. The Li-based film 390 deposited on the anodes 320 having a 3D structure may be a solid electrolyte film or a protective film. The Li-based film 390 may be formed by the PECVD method according to the above-described exemplary embodiment.

Figure 16:
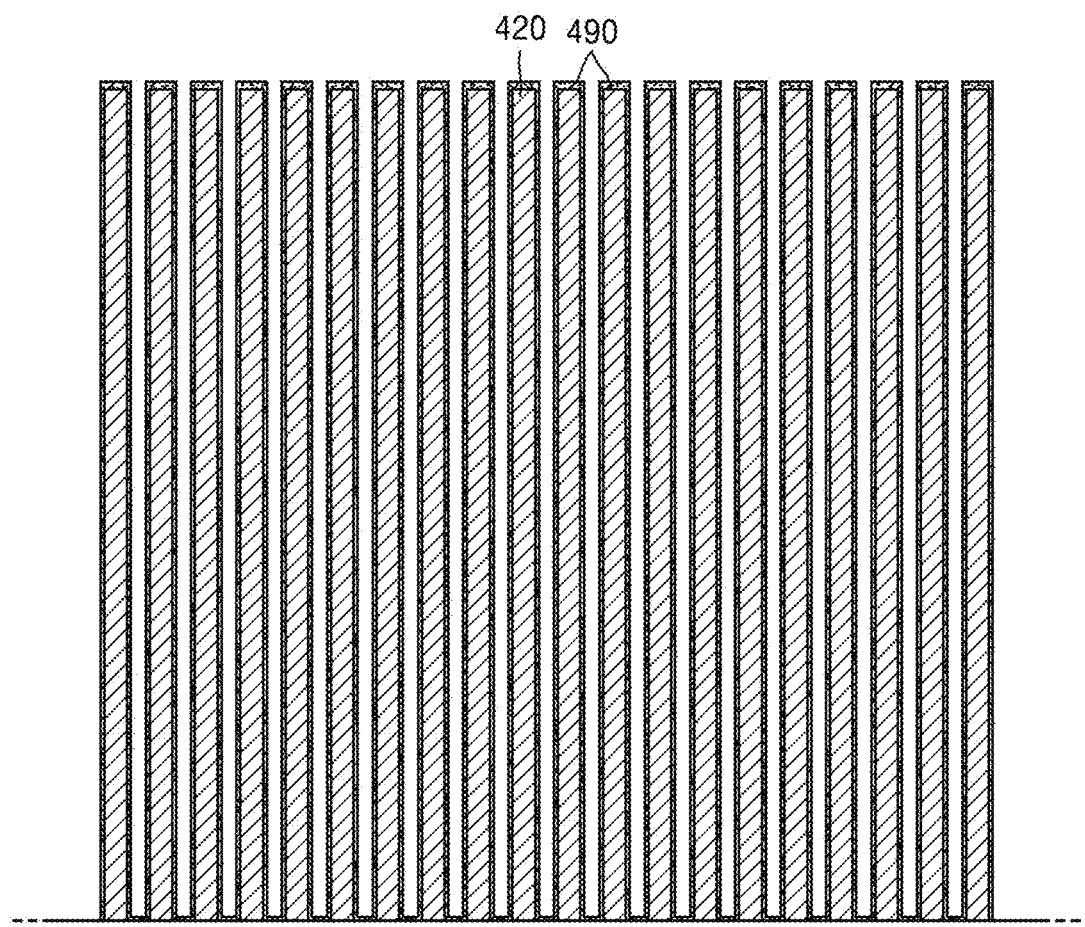
FIG. 16 illustrates a Li-based film formed on conductive carbon electrodes having a 3D structure, according to another exemplary embodiment.

FIG. 16 illustrates a Li-based film 490 formed on conductive carbon electrodes 420 having a 3D structure, according to another exemplary embodiment.

Referring to FIG. 16, the Li-based film 490 is deposited on the conductive carbon electrodes 420 having a 3D structure arranged parallel to each other. The conductive carbon electrodes 420 are electrodes used for metal-air batteries and may have a high aspect ratio of, for example, 1:1 or greater. The Li-based film 490 deposited on the conductive carbon electrodes 420 having a 3D structure may be a solid electrolyte film or a protective film. The Li-based film 490 may be formed by the PECVD method according to the above-described exemplary embodiment.

According to the above exemplary embodiments, the process of supplying the Li source material into the reaction chamber to form a Li-based film and the process of supplying the P and O source materials and the N source material into the reaction chamber are performed with a time interval. Accordingly, when plasma is generated in the process of supplying the P and O source materials and the N source material into the reaction chamber, the intrusion of the Li source material and so forth and the impurities into the reaction chamber may be prevented. Also, as the controller controls the on-off time of plasma, the supply of the N source material into the reaction chamber may be easily controlled.

Also, since the source materials are adsorbed on the surface of the substrate in a state in which plasma is not generated in the reaction chamber, the step coverage problem may be solved. Since the Li-based film is deposited in a state in which plasma is generated in the reaction chamber, the Li-based film may be formed at a relatively fast speed. Accordingly, the Li-based film may be uniformly deposited on the 3D structure having a high aspect ratio at a relatively fast speed. The Li-based film may be deposited on the electrode having, for example, a 3D structure to be used as a solid electrolyte film or a protective film. Also, the Li-based film may be deposited on a conductive carbon electrode of a metal-air battery to be used as a solid electrolyte film or a protective film. However, the present exemplary embodiment is not limited thereto and may be applied to other various fields.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A method of forming a lithium (Li)-based film, the method comprising:
   supplying a Li source material into a reaction chamber in which a substrate is disposed, in a first time duration;
   supplying phosphor (P) and oxygen (O) source materials and a nitrogen (N) source material into the reaction chamber, in a second time duration and a third time duration; and
   generating plasma in the reaction chamber to form a Li-based film on the substrate from the Li, P, O, and N source materials in the third time duration by supplying power into the reaction chamber in the third time duration and not in the first time duration and the second time duration,
   wherein the supplying of the Li source material into the reaction chamber and the supplying of the P and O source materials and the N source material into the reaction chamber are performed with a time interval,
   wherein the Li source material supplied into the reaction chamber is deposited on the substrate, and the P and O source materials supplied into the reaction chamber are adsorbed on the Li source material, and
   wherein the second time duration follows the first time duration, and the third time duration follows the second time duration.

2. The method of claim 1, further comprising purging an interior of the reaction chamber between the supplying of the Li source material into the reaction chamber and the supplying of the P and O source materials and the N source material into the reaction chamber.

3. The method of claim 1, wherein a bonding between the P source material and the N source material (P—N bonding) is formed by generating the plasma in the reaction chamber when the P and O source materials and the N source material are supplied into the reaction chamber.

4. The method of claim 3, wherein an amount of the N source material supplied into the reaction chamber is adjusted by controlling an on-off time of generation of the plasma.

5. The method of claim 1, further comprising purging an interior of the reaction chamber after the Li-based film is formed on the substrate.

6. The method of claim 1, wherein a reaction temperature of the substrate in a process of forming the Li-based film is about 100° C. to about 450° C.

7. The method of claim 1, wherein the substrate comprises at least one three-dimensional (3D) structure having an aspect ratio of at least 1:1.

8. The method of claim 7, wherein the 3D structure comprises a cathode having a 3D structure, and the Li-based film comprises a solid electrolyte film deposited on a surface of the cathode.

9. The method of claim 7, wherein the 3D structure comprises an anode having a 3D structure, and the Li-based film comprises a solid electrolyte film or a protective film deposited on a surface of the anode.

10. The method of claim 7, wherein the 3D structure comprises a conductive carbon electrode having a 3D structure, and the Li-based film comprises a solid electrolyte film or a protective film deposited on a surface of the conductive carbon electrode.

* * * * *